(12) United States Patent
Pagaila et al.

(10) Patent No.: US 7,847,382 B2
(45) Date of Patent: Dec. 7, 2010

(54) INTEGRATED CIRCUIT PACKAGING SYSTEM WITH PACKAGE STACKING AND METHOD OF MANUFACTURE THEREOF

(75) Inventors: Reza Argenty Pagaila, Singapore (SG); Byung Tai Do, Singapore (SG)

(73) Assignee: Stats Chippac Ltd., Singapore (SG)

( * ) Notice: Subject to any disclaimer, the term of this patent is extended or adjusted under 35 U.S.C. 154(b) by 28 days.

(21) Appl. No.: 12/412,064

(22) Filed: Mar. 26, 2009

(65) Prior Publication Data

US 2010/0244219 A1    Sep. 30, 2010

(51) Int. Cl.
*H01L 23/485* (2006.01)
(52) U.S. Cl. .................. 257/684; 257/698; 257/778; 257/E21.512; 257/E23.011; 257/E23.126; 257/E21.614; 257/E25.027
(58) Field of Classification Search ............... 257/684, 257/698, 778, E21.512, E23.011, E23.126, 257/E21.614, E25.027; 438/108, 109
See application file for complete search history.

(56) References Cited

U.S. PATENT DOCUMENTS

| | | | |
|---|---|---|---|
| 6,582,992 B2 | 6/2003 | Poo et al. | |
| 6,753,205 B2 | 6/2004 | Halahan | |
| 6,908,856 B2 | 6/2005 | Beyne et al. | |
| 6,998,334 B2 | 2/2006 | Farnworth et al. | |
| 7,138,706 B2 * | 11/2006 | Arai et al. | 257/678 |
| 7,679,178 B2 * | 3/2010 | Pu et al. | 257/686 |
| 2005/0263869 A1 | 12/2005 | Tanaka et al. | |
| 2006/0079024 A1 | 4/2006 | Akram | |
| 2007/0052080 A1 | 3/2007 | Chen | |
| 2007/0145548 A1 * | 6/2007 | Park et al. | 257/678 |
| 2007/0181990 A1 * | 8/2007 | Huang et al. | 257/686 |
| 2007/0269931 A1 | 11/2007 | Chung et al. | |
| 2008/0012111 A1 * | 1/2008 | Pu et al. | 257/686 |
| 2008/0029869 A1 * | 2/2008 | Kwon et al. | 257/686 |
| 2008/0032450 A1 * | 2/2008 | Huang | 438/108 |
| 2008/0079120 A1 | 4/2008 | Foster et al. | |
| 2008/0272464 A1 | 11/2008 | Do et al. | |
| 2008/0272465 A1 | 11/2008 | Do et al. | |
| 2008/0272476 A1 | 11/2008 | Do et al. | |
| 2008/0272477 A1 | 11/2008 | Do et al. | |
| 2008/0272499 A1 | 11/2008 | DeNatale et al. | |
| 2008/0283994 A1 * | 11/2008 | Tsai et al. | 257/686 |
| 2009/0032933 A1 * | 2/2009 | Tracht et al. | 257/693 |
| 2009/0127700 A1 * | 5/2009 | Romig | 257/712 |
| 2009/0140408 A1 * | 6/2009 | Lee et al. | 257/686 |
| 2009/0315170 A1 * | 12/2009 | Shim et al. | 257/692 |
| 2010/0027233 A1 * | 2/2010 | Low et al. | 361/810 |
| 2010/0133682 A1 * | 6/2010 | Meyer | 257/698 |

OTHER PUBLICATIONS

U.S. Appl. No. 12/133,177, filed Jun. 4, 2008, Pagaila et al.

* cited by examiner

*Primary Examiner*—George Fourson
(74) *Attorney, Agent, or Firm*—Mikio Ishimaru

(57) ABSTRACT

A method of manufacture of an integrated circuit packaging system includes: forming an encapsulation surrounding an integrated circuit having an inactive side and an active side exposed; forming a hole through the encapsulation with the hole not exposing the integrated circuit; forming a through conductor in the hole; and mounting a substrate with the integrated circuit surrounded by the encapsulation with the active side facing the substrate.

20 Claims, 4 Drawing Sheets

INTEGRATED CIRCUIT PACKAGING SYSTEM WITH PACKAGE STACKING AND METHOD OF MANUFACTURE THEREOF

CROSS-REFERENCE TO RELATED APPLICATION(S)

The present application contains subject matter related to co-pending U.S. patent application Ser. No. 12/133,177, assigned to STATS ChipPAC Ltd.

TECHNICAL FIELD

The present invention relates generally to an integrated circuit packaging system, and more particularly to an integrated circuit packaging system with an encapsulation.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages using electrical connections.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry and the amount of electrical connections inside a product are key to improving the features, performance, and reliability of any product. Furthermore, the ways the circuitry and electrical connections are implemented are related to the packaging size, packaging methods, and the individual packaging designs.

Attempts have failed to provide a complete solution addressing simplified manufacturing processing, smaller dimensions, lower costs due to design flexibility, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming an encapsulation surrounding an integrated circuit having an inactive side and an active side exposed; forming a hole through the encapsulation with the hole not exposing the integrated circuit; forming a through conductor in the hole; and mounting a substrate with the integrated circuit surrounded by the encapsulation with the active side facing the substrate.

The present invention provides an integrated circuit packaging system including: an integrated circuit having an inactive side and an active side; an encapsulation surrounding the integrated circuit with the inactive side and the active side exposed, and the encapsulation having a hole not exposing the integrated circuit; a through conductor in the hole; and a substrate mounted with the integrated circuit surrounded by the encapsulation with the active side facing the substrate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
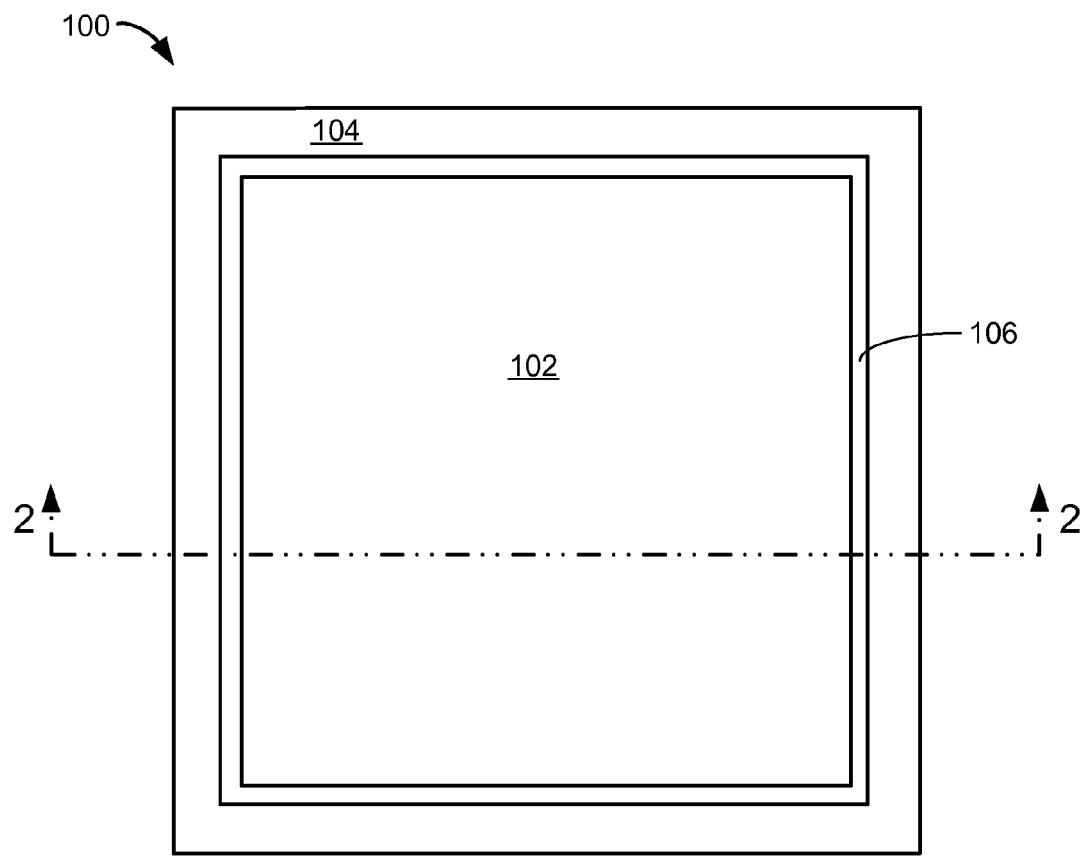
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can include a stack package 102, such as an integrated circuit package, a passive component, an integrated circuit die, a thermal heat sink, or of any combination thereof, over a substrate 104, such as a package substrate, circuit board, or interposer. An underfill 106, such as an epoxy-based compound, can be seen below the stack package 102. The underfill 106 is optional.

For purposes of illustration, the integrated circuit packaging system 100 is shown with the stack package 102 having a footprint area smaller than the footprint area of the substrate 104, although it is understood that the integrated circuit packaging system 100 can have a different configuration. For example, the relative footprint of the stack package 102 can be the same size or larger than the footprint of the substrate 104.

Figure 2:
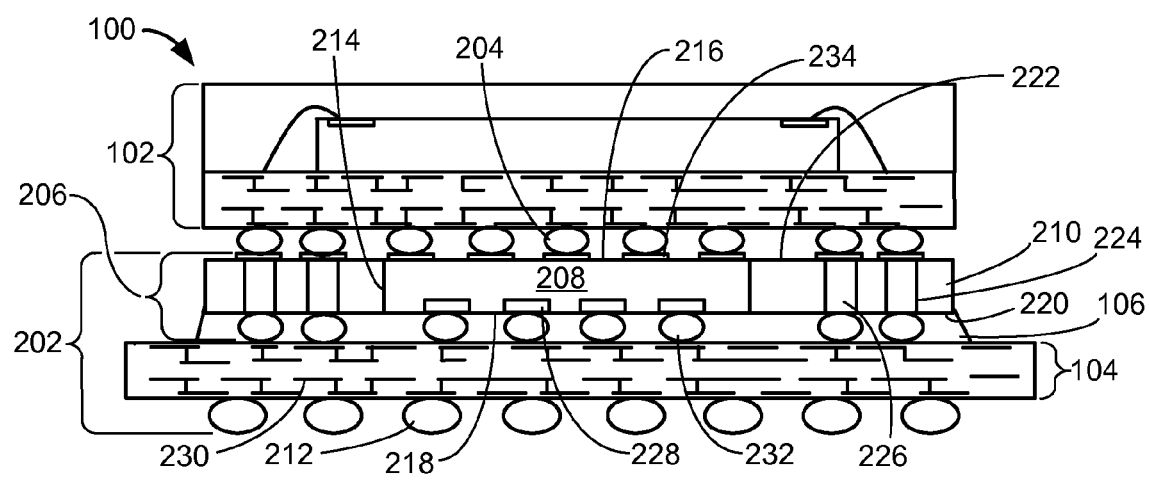
FIG. 2 is a cross-sectional view of the integrated circuit packaging system of the present invention taken along a line 2-2 of FIG. 1.

Referring now to FIG. 2, therein is shown a cross-sectional view of the integrated circuit packaging system 100 of the present invention taken along a line 2-2 of FIG. 1. The integrated circuit packaging system 100 can include a base package 202 connected to the stack package 102 using interconnects 204, such as solder, solder balls, solder dots, solder bumps, or other conductive structures.

The base package 202 can preferably include a circuit assembly 206. The circuit assembly 206 can include an integrated circuit 208, such as an integrated circuit die or integrated circuit device, an encapsulation 210, and the substrate 104 with package connectors 212, such as solder balls, solder bumps, metallic or metallic alloy structures, or other conductive structures. The encapsulation 210, for example, can include an organic molding compound, an epoxy molding compound (EMC), polymide compound, or a wire-in-film (WIF).

Sides 214 of the integrated circuit 208 can preferably be surrounded by the encapsulation 210. An inactive side 216 and an active side 218 with active circuitry fabricated thereon of the integrated circuit 208 can be exposed from the encapsulation 210. For example, a first side 220 of the encapsulation 210 can be coplanar with the active side 218. A second side 222 of the encapsulation 210 can be coplanar to the inactive side 216. The first side 220 and the second side 222 can be parallel to each other.

Holes 224 can be formed through the encapsulation 210 between the first side 220 and the second side 222. The holes 224 do not expose the sides 214 of the integrated circuit 208.

A through conductor 226, such as a conductor including solder, aluminum, copper, silver, gold, or other conductive materials, can be formed within each of the holes 224. The through conductor 226 can traverse both ends of each of the holes 224. The through conductor 226 can be isolated with no direct connection to chip pads 228 of the integrated circuit 208 forming the dummy the through organic via (TOV).

The circuit assembly 206 can be mounted over the substrate 104 using electrical connectors 232 to connect the substrate 104 with the active side 218 or with the through conductor 226. The package connectors 212 can attach to a side opposing the side of the substrate 104 facing the circuit assembly 206.

Conductive layers 230, such as conductive traces, can be located within or on the substrate 104. The conductive layers 230 can provide connectivity between the package connectors 212, the electrical connectors 232, or the package connectors 212 and the electrical connectors 232. The underfill 106 can be applied between the circuit assembly 206 and the substrate 104.

The stack package 102 can be mounted over the inactive side 216 of the circuit assembly 206 of the base package 202 using the interconnects 204. The interconnects 204 can be located over the through conductor 226 or distributed over the inactive side 216. The inactive side 216 can optionally include a mountable contact 234, such as a re-distribution layer (RDL), thereover. The through conductor 226 exposed along the second side 222 can also optionally include having the mountable contact 234 thereover.

The mountable contact 234 can be over the through conductor 226 or over areas of the inactive side 216. The mountable contact 234 can be located between the interconnects 204 and the through conductor 226 or the inactive side 216.

For illustrative purposes, the integrated circuit packaging system 100 is shown with the holes 224 having an orientation perpendicular to the first side 220. It is understood that the integrated circuit packaging system 100 can have a different configuration of the holes 224. For example, the holes 224 can be oblique or obtuse to the first side 220.

Also for illustrative purposes, the integrated circuit packaging system 100 is shown with the holes 224 having a separation from one another by a distance equivalent to the cross-sectional width of one of the holes 224. It is understood that the integrated circuit packaging system 100 can have a different configuration of the holes 224. For example, the separation between the holes 224 can be greater or less than the cross-sectional width of the holes 224.

Further, for illustrative purposes, the integrated circuit packaging system 100 is shown with the holes 224 having a uniform cross-sectional width across the length of each of the holes 224. It is understood that the integrated circuit packaging system 100 can have a different configuration of the holes 224. For example, the cross-sectional width of a section of the holes 224 can have a different cross-sectional width of another section of the holes 224.

It has been discovered that the present invention provides the integrated circuit packaging system 100 with improved density connectivity and costs benefits. Reducing the separation distance between each of the holes 224 will increase the number of connections between the stack package 102 and the base package 202. Reducing the width of each of the holes 224 will enable the interconnects 204 or the electrical connectors 232 to decrease in size resulting in increased IO density between the stack package 102 and the base package 202 and reduction of solder ball collapse.

Figure 3:
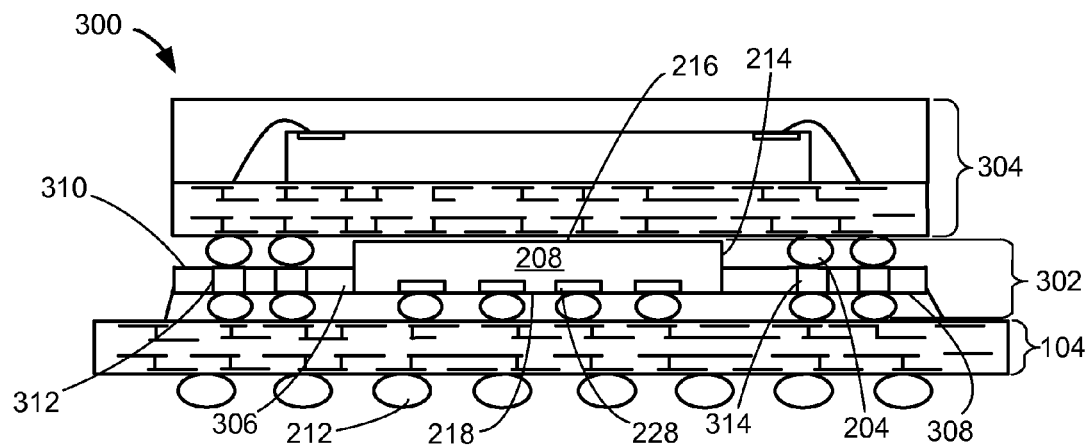
FIG. 3 is a cross-sectional view of an integrated circuit packaging system exemplified by the top view along line 2-2 of FIG. 1 in a second embodiment of the present invention.

Referring now to FIG. 3, therein is shown a cross-sectional view of an integrated circuit packaging system 300 exemplified by the top view along line 2-2 of FIG. 1 in a second embodiment of the present invention. The integrated circuit packaging system 300 can be similar to the integrated circuit packaging system 100 of FIG. 2 except the integrated circuit packaging system 300 includes a circuit assembly 302 and a stack package 304, such as an integrated circuit package, a passive component, an integrated circuit die, a thermal heat sink, or of any combination thereof.

The circuit assembly 302 can preferably exclude the use of any re-distribution layer and include the integrated circuit 208, an encapsulation 306 which includes organic materials, and the substrate 104 with the package connectors 212. The integrated circuit 208 can be surrounded by the encapsulation 306 having a first side 308 within a plane containing the active side 218 and a second side 310 coplanar with and between the active side 218 and the inactive side 216.

Holes 312 having ends connected by an open passage can be formed adjacent the integrated circuit 208. Each of the holes 312 can have an end exposed adjacent the first side 308 and an opposite end exposed adjacent the second side 310.

A through conductor 314 which includes conductive material, such as solder or other material having conductive and connective properties, can be formed within each of the holes 312 to connect an end of each of the holes 312 with the opposite end of each of the holes 312. The holes 312 or the through conductor 314 within each of the holes 312 have no direct connections to any of the chip pads 228 of the integrated circuit 208.

The stack package 304 can be mounted over the circuit assembly 302, next to the inactive side 216, to the through conductor 314 the using the interconnects 204 resulting in connectivity between the stack package 304, the substrate 104, or next level of system integration, such as a printed circuit board or another package connected with the package connectors 212. The stack package 304 can be isolated from the inactive side 216 having with no connectivity to the inactive side 216.

The integrated circuit packaging system 300 provides a packaging solution having electrical connectivity equivalent to the integrated circuit packaging system 100 with an overall height less than the overall height of the integrated circuit packaging system 100.

It has been discovered that the present invention provides the integrated circuit packaging system 300 with cost savings and reduced fabrication processing over the integrated circuit packaging system 100. Omission of any re-distribution layer results with the integrated circuit packaging system 300 results in costs savings attributed to the elimination of the use of re-distribution layering material and reduced manufacturing time as a result of the elimination of the re-distribution application step.

It has also been discovered that the present invention provides the integrated circuit packaging system 300 with a reduced profile solution as well as further cost savings over the integrated circuit packaging system 100. The second side 310 below the inactive side 216, the elimination of connectivity between the stack package 304 and the inactive side 216, and the reduction in the quantity of the encapsulant 306 necessary for the integrated circuit packaging system 300 resulted in a reduced profile and further cost savings.

Figure 4:
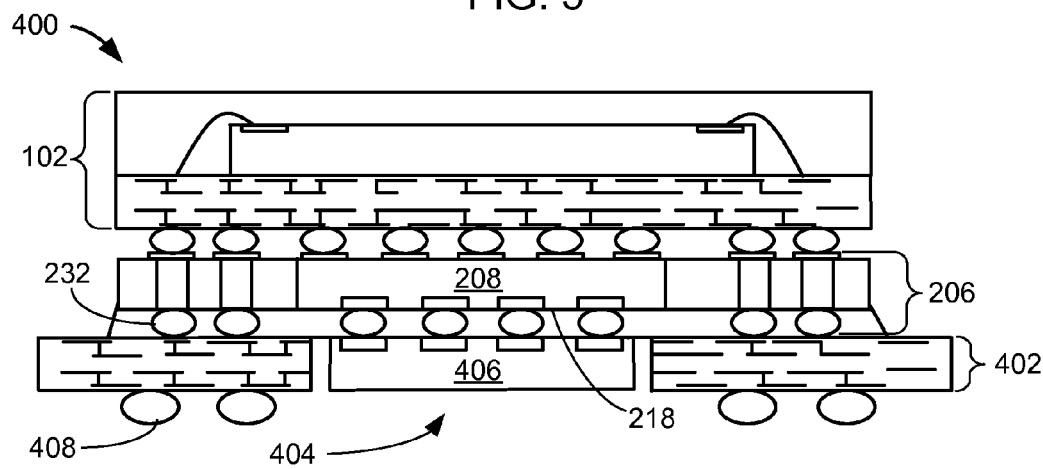
FIG. 4 is a cross-sectional view of an integrated circuit packaging system exemplified by the top view along line 2-2 of FIG. 1 in a third embodiment of the present invention.

Referring now to FIG. 4, therein is shown a cross-sectional view of an integrated circuit packaging system 400 exemplified by the top view along line 2-2 of FIG. 1 in a third embodiment of the present invention. The integrated circuit packaging system 400 can be similar to the integrated circuit packaging system 100 except the integrated circuit packaging system 400 includes a substrate 402, such as a package substrate, circuit board, or interposer, a base opening 404, and a base device 406. The base opening 404, such as a hollowed opening or hollowed space, formed within the perimeter of the substrate 402 and package connectors 408.

The base opening 404 can preferably have internal physical dimensions larger than the overall external physical dimensions of the base device 406, such as an integrated circuit die, passive component, integrated circuit device, or combinations thereof. The base opening 404 can be formed from one side of the substrate 402, through the substrate 402, to the opposite side of the substrate 402.

The base opening 404 can preferably be located below the active side 218 of the integrated circuit 208 of the circuit assembly 206, exposing the electrical connectors 232 attached to the integrated circuit 208. The base device 406 can be inserted within the base opening 404 and circuitry of the base device 406 can be connected with the circuitry of the integrated circuit 208 using the electrical connectors 232.

Electrically conductive materials located within or on a side of the substrate 402 can provide connectivity with the electrically conductive materials with the opposite side of the substrate 402. The package connectors 408, such as solder balls, solder bumps, or conductive posts, on a side opposite the side of the substrate 402 facing the circuit assembly 206 can provide connectivity between the stack package 102, the integrated circuit 208, the base device 406, or the substrate 402 and a next level of integration.

Figure 5:
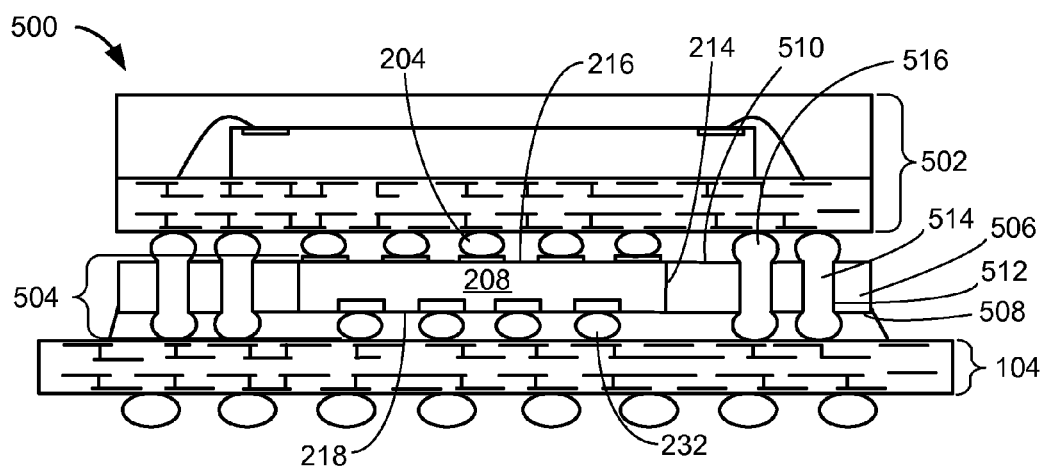
FIG. 5 is a cross-sectional view of an integrated circuit packaging system exemplified by the top view along line 2-2 of FIG. 1 in a fourth embodiment of the present invention.

Referring now to FIG. 5, therein is shown a cross-sectional view of an integrated circuit packaging system 500 exemplified by the top view along line 2-2 of FIG. 1 in a fourth embodiment of the present invention. The integrated circuit packaging system 500 can be similar to the integrated circuit packaging system 100 except the integrated circuit packaging system 500 includes a stack package 502 and a circuit assembly 504.

The circuit assembly 504 includes having the integrated circuit 208 and an encapsulation 506 which includes organic materials. The sides 214 of the integrated circuit 208 can preferably be surrounded by the encapsulation 506 which includes organic materials. The inactive side 216 and the active side 218 of the integrated circuit 208 can be exposed adjacent the encapsulation 506. For example, the inactive side 216 and the active side 218 can be coplanar to the encapsulation 506. A first side 508 of the encapsulation 506, adjacent to the active side 218, can be coplanar with a second side 510 of the encapsulation 506, adjacent to the inactive side 216.

Holes 512 having ends connected by an open passage, can be formed adjacent the integrated circuit 208. Each of the holes 512 can have an end exposed adjacent the first side 508 and an opposite end exposed adjacent the second side 510. The circuit assembly 504 can preferably be mounted over the substrate 104 using the electrical connectors 232 to connect the substrate 104 with the active side 218.

The stack package 502, such as an integrated circuit package, a passive component, an integrated circuit die, a thermal heat sink, or of any combination thereof, can preferably be connected over the circuit assembly 504 using the interconnects 204 or a through conductor 514.

The interconnects 204 and the through conductor 514 can be made from the same material, such as a conductor including solder, aluminum, copper, silver, gold, or other conductive materials. The through conductor 514 can form a protrusion 516 at each end. The protrusion 516 can extend beyond the encapsulation 506. The interconnects 204 provide connectivity between the stack package 502 and the inactive side 216.

The through conductor 514 can be located over one of the holes 512, having an end connected to the stack package 502 and an opposite end connected directly to the substrate 104 to provide connectivity through the holes 512 and between the stack package 502 and the substrate 104.

The through conductor 514 could, for example, be attached to the stack package 502 and then attached to the substrate 104 using a reflow process, such as heating by an infrared device, an oven enclosure, a source of directed hot air, or a thermal radiating apparatus. The reflow process can attach the interconnects 204 to the circuit assembly 504.

The reflow process can form the through conductor 514 in the holes 512 from a conductive structure (not shown), such as a conductive ball, a conductive post, or a solder ball, attached to the stack package 502. The reflow process can form the protrusion 516 of the through conductor 514.

The integrated circuit packaging system 500 can provide significant improvements in manufacturing costs and process time when compared with the manufacturing costs and process time of the integrated circuit packaging system 100. The significant improvements can be attributed to the use of the through conductor 514 to connect the stack package 502 with the substrate 104 compared with the use of the through conductor 226 of FIG. 2, the interconnects 204, and the electrical connectors 232 used to connect the stack package 102 of FIG. 2 with the substrate 104.

Figure 6:
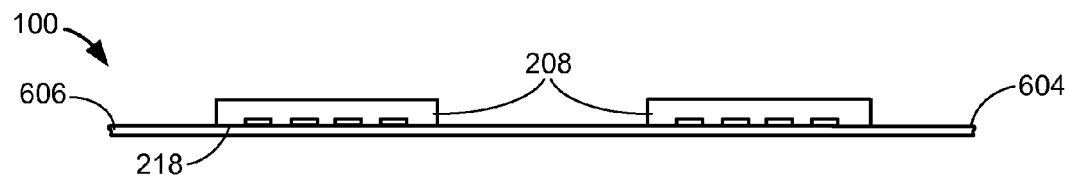
FIG. 6 is the cross-sectional view of the integrated circuit packaging system of FIG. 2 in an attaching phase of the integrated circuit to a wafer carrier.

Referring now to FIG. 6, therein is shown the cross-sectional view of the integrated circuit packaging system 100 of FIG. 2 in an attaching phase of the integrated circuit 208 to a wafer carrier 606. The active side 218 of the integrated circuit 208 and can be attached to a top side 604 of the wafer carrier 606.

For example, a bonding agent, such as a wax, solvable glue, thermally releasable adhesive tape, electrostatic, or other appropriate attaching material, can be used for attaching the integrated circuit 208 and the wafer carrier 606. The circuitry within of the each of the integrated circuit 208 can be the identical or different from one another.

Figure 7:
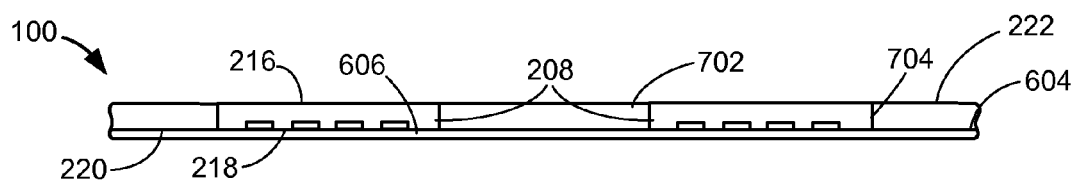
FIG. 7 is the structure of FIG. 6 in a forming phase of a cover.

Referring now to FIG. 7, therein is shown the structure of FIG. 6 in a forming phase of a cover 702. The cover 702 can include an organic molding compound over the top side 604 of the wafer carrier 606 surrounding sides 704 of the integrated circuit 208. The cover 702 can include the first side 220 along the active side 218 and the second side 222 opposite the first side 220.

The second side 222 can be formed with a number of processes. For example, the second side 222 can be formed with a molding, sawing, grinding, or similar controlled surface processing method. The second side 222 can be coplanar with, over, or below the inactive side 216 of the integrated circuit 208. The inactive side 216 can optionally be exposed or not be exposed for additional protection.

Figure 8:
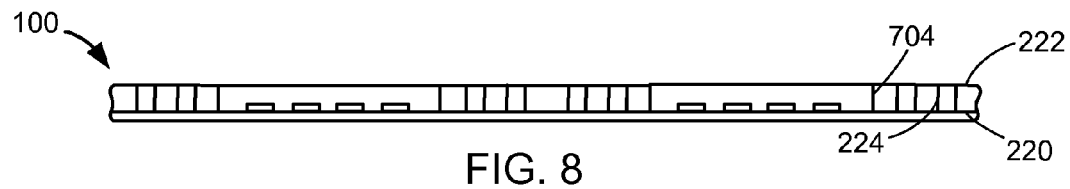
FIG. 8 is the structure of FIG. 7 in a forming phase of the holes.

Referring now to FIG. 8, therein is shown structure of FIG. 7 in a forming phase of the holes 224. Each of the holes 224 can be formed by a number of processes. For example, the holes 224 can be formed by drilling or etching through the cover 702 between the second side 222 and the first side 220 of the cover 702. The holes 224 can formed adjacent at least one of the sides 704.

Figure 9:
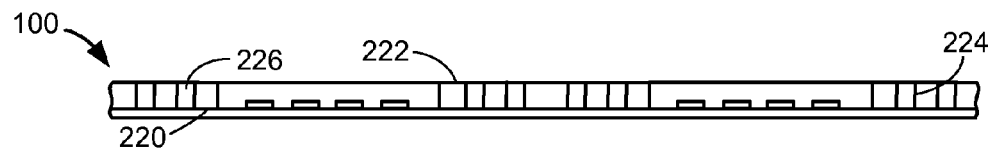
FIG. 9 is the structure of FIG. 8 in a filling phase of the through conductor.

Referring now to FIG. 9, therein is shown the structure of FIG. 8 in a filling phase of the through conductor 226. This filling phase is optional. The through conductor 226 can be formed in the holes 224 employing a number of different processes. For example, the through conductor 224 can be formed with a filling process, an injecting process, or a dispensing process. The through conductor 226 can be exposed from the first side 220 and the second side 222.

Figure 10:
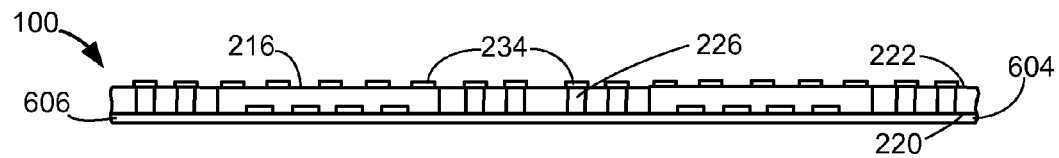
FIG. 10 is the structure of FIG. 9 in a forming phase of the mountable contact.

Referring now to FIG. 10, therein is shown the structure of FIG. 9 in a forming phase of the mountable contact 234. The mountable contact 234 can optionally be applied over the through conductor 226 or distributed over the inactive side 216. The mountable contact 234 can be formed with a number of processes. For example, the mountable contact 234 can be formed by a plating, laminating, or vapor deposition.

Figure 11:
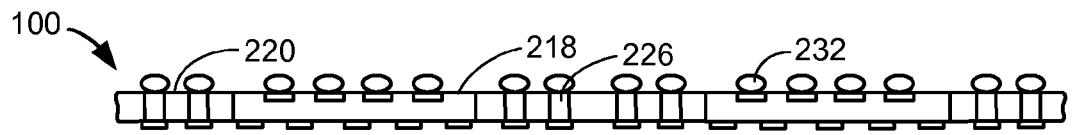
FIG. 11 is the structure of FIG. 10 in an attaching phase of the electrical connectors.

Referring now to FIG. 11, therein is shown the structure of FIG. 10 in an attaching phase of the electrical connectors 232. The structure of FIG. 11 is shown oriented with the first side 220 and the active side 218 facing up. The wafer carrier 606 of FIG. 10 is removed from the first side 220 and the active side 218 using a separating process, such as a thermal process, an ultra violet process, or a chemical process.

The electrical connectors 232 can be attached over the through conductor 226 or the active side 218 using the attaching process. For example, the attaching process can include directed convection heat or laser.

Figure 12:
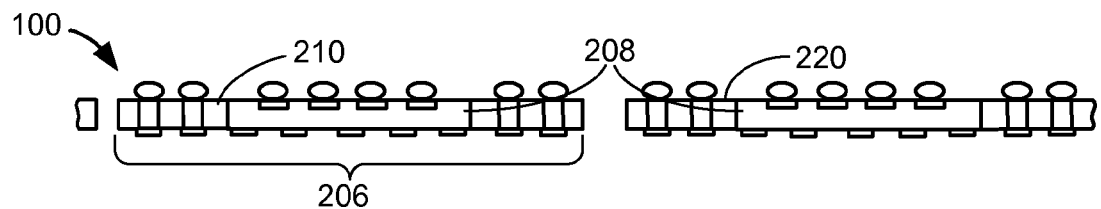
FIG. 12 is the structure of FIG. 11 in a singulating phase of the circuit assembly.

Referring now to FIG. 12, therein is shown the structure of FIG. 11 in a singulating phase of the circuit assembly 206. The cover 702 of FIG. 7 can be singulated with a number of processes, such as a sawing or laser scribing, forming the encapsulation 210. The integrated circuit 208 is shown separated and isolated from the other instances of the integrated circuit 208 resulting in the formation of the circuit assembly 206.

Figure 13:
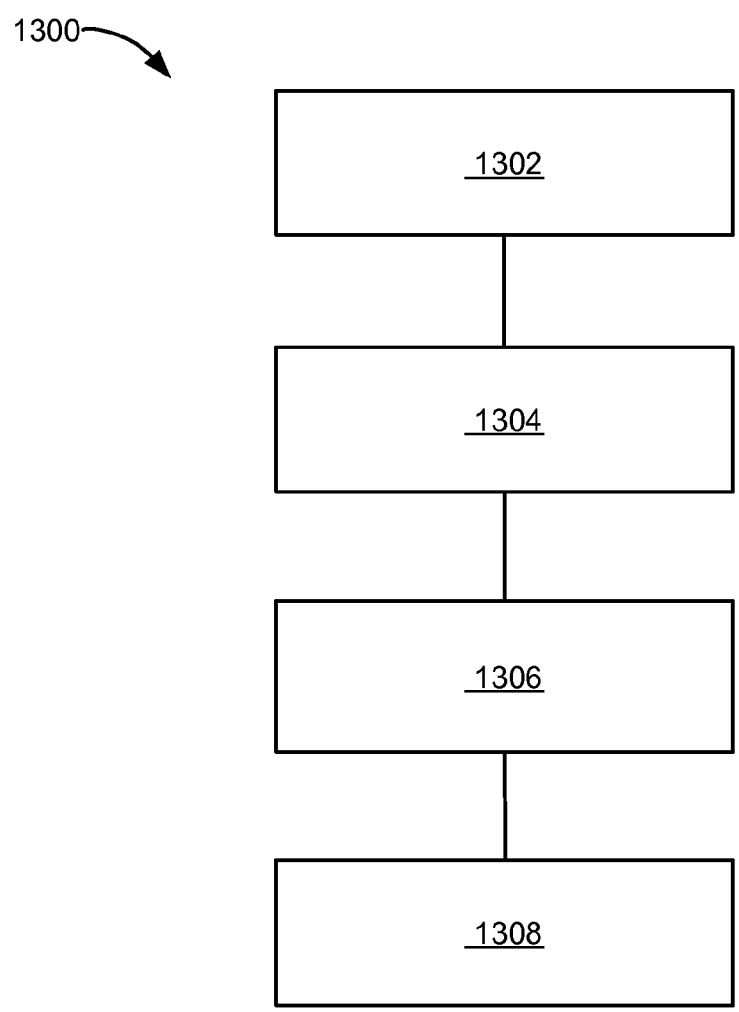
FIG. 13 is a flow chart of a method of manufacture of an integrated circuit packaging system in a further embodiment of the present invention.

Referring now to FIG. 13 therein is shown a flow chart of a method 1300 of manufacture of an integrated circuit packaging system 100 in a further embodiment of the present invention. The method 1300 includes forming an encapsulation surrounding an integrated circuit having an inactive side and an active side exposed in a block 1302; forming a hole through the encapsulation with the hole not exposing the integrated circuit in a block 1304; forming a through conductor in the hole in a block 1306; and mounting a substrate with the integrated circuit surrounded by the encapsulation with the active side facing the substrate in a block 1308.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package on package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
forming an encapsulation surrounding an integrated circuit having an inactive side and an active side exposed;
forming a hole through the encapsulation with the hole not exposing the integrated circuit;
forming a through conductor in the hole; and
mounting a substrate with the integrated circuit surrounded by the encapsulation with the active side facing the substrate.

2. The method as claimed in claim 1 wherein forming the encapsulation surrounding the integrated circuit having the inactive side and the active side exposed includes forming the encapsulation below the inactive side.

3. The method as claimed in claim 1 further comprising:
providing the substrate having a base opening; and
connecting a base device, inside the base opening, with the active side facing the base device.

4. The method as claimed in claim 1 further comprising:
forming a mountable contact over the through conductor or over the inactive side; and
connecting a stack package over the inactive side and over the through conductor.

5. The method as claimed in claim 1 wherein:
forming the through conductor includes forming the through conductor having a protrusion with the protrusion extended beyond the encapsulation; and
further comprising:
connecting a stack package over the inactive side and over the through conductor includes connecting the protrusion to the stack package and the substrate.

6. A method of manufacture of an integrated circuit packaging system comprising:
forming an encapsulation surrounding an integrated circuit having an inactive side and an active side exposed and the encapsulation is coplanar with the active side;
forming a hole through the encapsulation with the hole not exposing the integrated circuit;
forming a through conductor in the hole; and
mounting a substrate with the integrated circuit surrounded by the encapsulation with the active side facing the substrate and an electrical connector between the active side and the substrate.

7. The method as claimed in claim 6 wherein mounting the substrate with the integrated circuit surrounded by the encapsulation with the active side facing the substrate and the electrical connector between the active side and the substrate includes connecting the electrical connector and the through conductor.

8. The method as claimed in claim 6 wherein forming the encapsulation surrounding the integrated circuit having the inactive side and the active side exposed includes forming the encapsulation coplanar with the active side and the inactive side.

9. The method as claimed in claim 6 further comprising applying an underfill between the substrate and the encapsulation.

10. The method as claimed in claim 6 wherein:
forming the through conductor includes forming the through conductor having a protrusion with the protrusion extended beyond the encapsulation; and
further comprising:
connecting a stack package over the inactive side and over the through conductor includes connecting the protrusion to the stack package and the substrate; and
connecting an interconnect over the inactive side with the interconnect made of the same material as the through conductor.

11. An integrated circuit packaging system comprising:
an integrated circuit having an inactive side and an active side;
an encapsulation surrounding the integrated circuit with the inactive side and the active side exposed, and the encapsulation having a hole not exposing the integrated circuit;
a through conductor in the hole; and
a substrate mounted with the integrated circuit surrounded by the encapsulation with the active side facing the substrate.

12. The system as claimed in claim 11 wherein the encapsulation is below the inactive side.

13. The system as claimed in claim 11 wherein:
the substrate includes the substrate having a base opening; and
further comprising:
a base device, inside the base opening, with the active side facing the base device.

14. The system as claimed in claim 11 further comprising:
a mountable contact over the through conductor or over the inactive side; and
a stack package connected over the mountable contact.

15. The system as claimed in claim 11 wherein:
the through conductor includes a protrusion with the protrusion extended beyond the encapsulation; and
further comprising:
a stack package connected over the inactive side and over the through conductor includes the protrusion connected to the stack package and the substrate.

16. The system as claimed in claim 11 further comprising:
an electrical connector between the active side and the substrate; and
wherein:
the encapsulation is coplanar with the active side.

17. The system as claimed in claim 16 wherein the electrical connector is connected to the through conductor.

18. The system as claimed in claim 16 wherein the encapsulation is coplanar with the active side and the inactive side.

19. The system as claimed in claim 16 further comprising an underfill between the substrate and the encapsulation.

20. The system as claimed in claim 16 wherein:
the through conductor includes a protrusion with the protrusion extended beyond the encapsulation and the protrusion connected to the substrate; and
further comprising:
a stack package connected to the protrusion; and
an interconnect connected over the inactive side with the interconnect made of the same material as the through conductor.

* * * * *